United States Patent

[11] 3,607,465

[72] Inventor Jean-claude Frouin
Defense Passive Caen, France

[21] Appl. No. 740,943
[22] Filed June 28, 1968
[45] Patented Sept. 21, 1971
[73] Assignee U.S. Philips Corporation
New York, N.Y.
[32] Priority June 30, 1967
[33] France
[31] 112630

[54] METHOD OF MANUFACTURING A SEMICONDUCTOR DEVICE COMPRISING A ZENER DIODE AND SEMICONDUCTOR DEVICE MANUFACTURED BY SAID METHOD
9 Claims, 16 Drawing Figs.

[52] U.S. Cl. .......... 148/175, 29/578, 317/234, 317/235
[51] Int. Cl. .......... H01l 7/36
[50] Field of Search .......... 148/174, 175; 29/578; 317/235, 22, 22.1, 30

[56] References Cited

UNITED STATES PATENTS

| | | | |
|---|---|---|---|
| 3,244,950 | 4/1966 | Ferguson | 317/235 |
| 3,327,182 | 6/1967 | Kisinko | 317/235 |
| 3,443,176 | 5/1969 | Agusta et al. | 317/235 |

*Primary Examiner*—L. Dewayne Rutledge
*Assistant Examiner*—R. A. Lester
*Attorney*—Frank R. Trifari

ABSTRACT: A method of making in a monolithic integrated semiconductor circuit a Zener diode having a reverse breakdown voltage in the range of 2.5–6 volts is described. This is obtained by constructing one of the diode zones as a heavily doped buried layer and the other diode zone as a heavily doped surface layer and out-diffusing the former and in-diffusing the latter until they meet to form an abrupt junction having the desired characteristics. A heavily doped surface contact region is diffused down to the buried zone to make available a surface contact for the latter.

INVENTOR.
BY JEAN-CLAUDE FROUIN
AGENT

INVENTOR.

BY JEAN-CLAUDE FROUIN

AGENT

INVENTOR.

BY JEAN-CLAUDE FROUIN

AGENT

INVENTOR.

BY JEAN-CLAUDE FROUIN

AGENT

INVENTOR.

BY JEAN-CLAUDE FROUIN

Frank R. Jinfani

AGENT

METHOD OF MANUFACTURING A SEMICONDUCTOR DEVICE COMPRISING A ZENER DIODE AND SEMICONDUCTOR DEVICE MANUFACTURED BY SAID METHOD

The invention relates to a method of manufacturing a semiconductor device comprising a Zener diode, in which two impurities are diffused into a semiconductor body to form the two adjacent diffused zones of opposite conductivity types of the Zener diode.

It is known to manufacture breakdown diodes which exhibit the Zener effect and/or the avalanche effect; they will be termed Zener diodes hereinafter. In linear and logical integrated circuits usually an emitter-base diode is employed, which is biassed in the forward direction and which has a substantially constant voltage with respect to the current level at the level of the operational current of said circuits, which voltage is of the order of 0.6 to 0.7 v. Since the voltages to be limited in linear or logical circuits usually amount to a few volts, it is necessary to connect in series a plurality of diodes in the forward direction. However, it is not possible to use more than three or four diodes because on the one hand more diodes would occupy too much space and on the other hand an increase in the number of circuit elements has to be avoided in view of reliability in operation. Therefore, Zener diodes are usually employed only for the voltage range between 0.6 and 2.5 v.

For voltages exceeding 6 v., these diodes are used in the reverse direction.

When the diodes are integrated in a monolithic circuit, the two zones of the diodes are obtained by two successive diffusions from the same surface of a semiconductor body, which diffusions may be carried out simultaneously with the diffusions of the bases and emitters of the transistors integrated in the same circuit.

For the voltage range between 2.5 and 6 v., suitable diodes cannot be obtained by said techniques. This voltage range is, however, very important for given uses in linear circuits receiving a supply voltage of, for example, 6, 12 or 24 v.

The present invention has for its object inter alia to provide a semiconductor device comprising a Zener diode which is capable of operating in the voltage range between 2.5 and 6 v., and particularly between 4 and 6 v.

It is known that the breakdown voltage of a junction depends upon the structure thereof. A junction between two zones having a high impurity content has a low breakdown voltage, but if one of the two zones has a low impurity content the breakdown voltage is high, even if the second zone is highly doped. This property is utilized in a method described in British Pat. Specification 1,046,152, in which a Zener diode having a high breakdown voltage, at least higher than 15 v., is arranged in a semiconductor body provided with an epitaxial layer. One of the zones of this diode is formed by a portion of the epitaxial layer of low doping and the other zone of the diode is a highly doped diffused zone. The high breakdown voltage aimed at in this case is due to the zone of low doping formed by a portion of the epitaxial layer.

It is furthermore known that a junction between two zones whose impurity content gradually decreases toward the junction (gradual junction) has a comparatively high breakdown voltage, whereas a junction between two zones whose impurity content varies strongly in the direct vicinity of the junction (abrupt junction) exhibits a lower breakdown voltage. The said Zener diodes obtained by two successive diffusions from the same surface of a semiconductor body have gradual junctions.

The present invention has furthermore for its object to provide a Zener diode capable of operating in the voltage range between 2.5 and 6 v., and formed by an abrupt junction operable in the reverse direction.

The invention is based on the recognition of the fact that it is possible to obtain a diffused junction with the desired breakdown voltage, which is substantially an abrupt junction, by diffusing two impurities of opposite conductivity types with a high concentration towards each other from opposite places in an intermediate portion of a semiconductor body until the diffused zones come into contact with each other.

According to the invention a method of manufacturing a semiconductor device comprising a Zener diode, in which two impurities are diffused into a semiconductor body to form the two adjacent diffused zones of opposite conductivity types of the Zener diode, is characterized in that these two diffusions are carried out from two prediffused at least partially opposite regions located one on each side of at least part of the semiconductor body.

A junction obtained by this method is an abrupt junction.

The prediffused regions may be arranged one on each side of a semiconductor layer. This layer may be an epitaxial layer on a semiconductor body or, for example, a semiconductor layer applied to an insulating substrate.

The invention is particularly important for the manufacture of integrated semiconductor devices and permits in a simple manner of arranging a Zener diode with the desired breakdown voltage in an integrated, monolithic semiconductor device.

An important embodiment of the method according to the invention for the manufacture of a monolithic, integrated semiconductor device comprising a semiconductor body having an epitaxial surface layer is characterized in that the two prediffused regions are provided one on each side of the epitaxial layer, one region forming a buried layer and the other forming a surface region.

A first further embodiment is characterized in that a zone, the so-called surface zone of the diode, diffused from the surface region is of the same conductivity type, termed herein, the one conductivity type, as the surface region, and a zone, the so-called buried zone of the diode, diffused from the buried layer is of the other conductivity type, while the buried layer is provided with a contact zone formed by a zone diffused into the surface layer down to the buried layer.

A second further embodiment is characterized in that a zone diffused from the surface region, the so-called surface zone of the diode, of a conductivity type opposite that of the surface layer and a zone diffused from the buried layer, the so-called buried zone of the diode, of the one conductivity type are provided while the buried layer is provided with a contact zone in the form of a diffused surface zone in the surface layer extending down to the buried layer.

A third embodiment is characterized in that the surface layer consists of two partial layers lying one on the other and having opposite conductivity types and a surface zone of the diode of substantially the same thickness as the upper partial layer is obtained by diffusion from the surface region and a buried zone of substantially the same thickness as the lower partial layer is obtained by diffusion from the buried layer, the diffused zones having the same conductivity type as the respective partial layers, while the upper partial layer is provided with a diffused contact zone for the buried zone of the diode.

It is preferred to provide a contact zone which completely surrounds the diffused surface zone of the diode.

In said three embodiments the manufacture of the diode according to the invention is compatible with that of devices obtained by the so-called planar techniques, so that it is possible to obtain the diode simultaneously with, for example, NPN or PNP transistors or field-effect transistors.

A further very important advantage of a Zener diode obtained by a method according to the invention consists in that this diode has a lower dynamic resistance at a low current level than a diode obtained by other methods.

In accordance with the structure of the semiconductor body employed and the method selected for the relative insulation of the circuit elements in the same semiconductor body and for the insulation of the circuit elements from the substrate the present invention may be carried into effect in various ways.

An important variant of said first and second embodiments is characterized in that a semiconductor body is employed in which the epitaxial surface layer is applied to a second epitaxial layer, both layer being of the one conductivity type, while the second layer is applied to a substrate of the other conductivity type and in that the layer composed of the surface layer and the second layer is divided into relatively insulated islands, the diode being arranged in one island.

A further important variant of said first embodiment is characterized in that a semiconductor body is employed in which the portion of the semiconductor body adjacent the epitaxial layer of the one conductivity type is of the other conductivity type, in that the surface layer is divided into relatively insulated islands and in that the buried zone of the diode is insulated by a second buried zone of the one conductivity type from said portion of the semiconductor body.

A further important variant of said first embodiment is characterized in that a semiconductor body is employed in which the epitaxial surface layer of the one conductivity type is applied to a second epitaxial layer of the other conductivity type and the second layer is applied to a substrate of the one conductivity type, in that the composite layer of said two layers is divided into relatively insulated islands and in that the diode is arranged in one island.

A further important variant of said second embodiment is characterized in that a semiconductor body is employed in which said portion of the semiconductor body adjacent the epitaxial surface layer of the one conductivity type is of the one conductivity type, in that the buried zone of the one conductivity type of the diode is insulated from said portion by a second buried zone of the other conductivity type and in that an insulating surface zone of the other conductivity type adjacent said second buried zone is provided in the surface layer so that it surrounds the surface zone of the other conductivity type of the diode so that the insulating surface zone and the second buried layer surround an insulated island in which the diode is arranged.

The invention furthermore relates to a semiconductor device manufactured by a method according to the invention.

The invention will now be described more fully with reference to the accompanying drawing:

FIG. 1*a* illustrates the concentration gradients of diffused impurities plotted against the diffusion depth in a gradual junction obtained by known techniques.

FIG. 1*b* illustrates the same in an abrupt junction obtained by a method according to the invention.

FIGS. 2*a* to 2*d* are diagrammatic sectional views of a first embodiment of semiconductor device according to the invention in various stages of manufacture.

FIGS. 3*a* and 3*b* are diagrammatic sectional views of a second embodiment in two stages of manufacture.

FIGS. 4*a* and 4*b* are diagrammatic sectional views of a third embodiment in two stages of manufacture.

FIGS. 5*a* and 5*b* are diagrammatic sectional views of a fourth embodiment in two stages of manufacture.

Figures 1A, 1B:
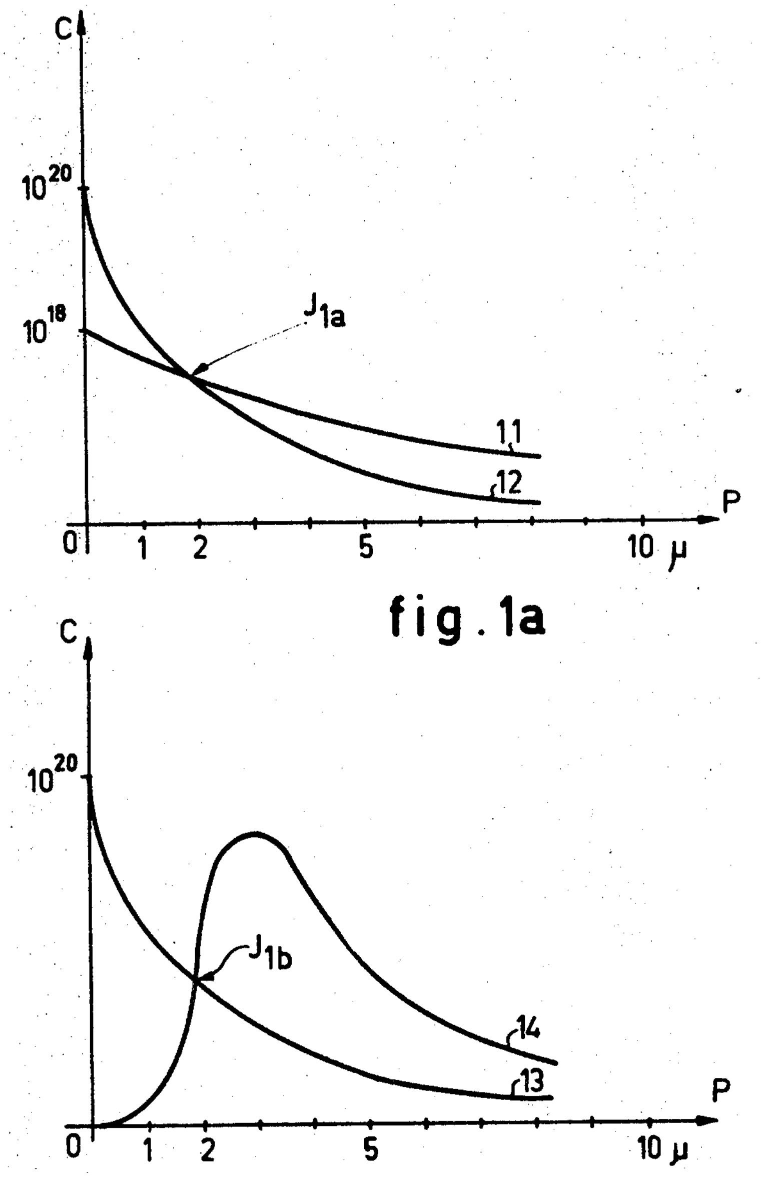

In FIG. 1*a* the curve 11 illustrates the variation of the impurity concentration C as a function of the depth P in a first diffusion from the surface of a semiconductor body and the curve 12 illustrates the variation of the impurity concentration obtained in a second diffusion from the same surface. The impurities bring about different conductivity types. Such concentration variations are obtained in a known method of manufacturing a Zener diode. The two diffusion fronts shift in the same directions but with different speeds so that the gradual junction $J_{1a}$ is obtained with a progressive variation of the impurity concentrations near the junction.

In FIG. 1*b* the curve 13 illustrates as a function of the depth P the variation of the impurity concentration C obtained in a diffusion from the surface of an epitaxial layer, whereas the curve 14 illustrates the variation of the impurity concentration obtained in a diffusion from the other surface of said epitaxial layer. The two diffusion fronts shift towards each other in the direction of thickness of said layer so that the abrupt junction $J_{1b}$ is obtained due to the strong variation of the concentrations near the junction. Such an abrupt junction is utilized in this invention.

With reference to FIGS. 2*a* to 2*d* an example of a method according to the invention will be described for the manufacture of an integrated semiconductor device comprising a Zener diode according to the invention and an NPN transistor.

Starting from a P-type silicon substrate 21 having a thickness of 150$\mu$ and a resistivity of about 5 to 10 Ohm. cm. (21 in FIG. 2*a*) the P-type prediffused regions **22*a*** are provided for obtaining insulating zones. The surface concentration is about $10^{19}$ to $10^{20}$ boron atoms per cc.

After this prediffusion an N-type layer **24*a* having a resistivity of about 0.5 Ohm. cm. and a thickness of 10 to 15$\mu$ (24*a*** in FIG. 2*b*) is applied epitaxially.

Into this epitaxial layer **24*a* arsenic is diffused to form the prediffused region 23*a*** in order to obtain a buried zone of the collector of the NPN transistor. The surface concentration is about $10^{20}$ to $10^{21}$ at./cc.

Then the P-type regions **22*b* are prediffused in the same manner as the regions 22*a*. At the same time the P-type region 25*a*** is prediffused in order to obtain the buried zone of the Zener diode.

A second N-type epitaxial layer **24*b* having the same resistivity as the layer 24*a*** and a thickness of 5 to 10$\mu$ is subsequently provided.

Into this second epitaxial layer the regions **22*c* are prediffused in the same manner as the regions 22*a* and 22*b*. At the same time the prediffused regions 25*b* is provided to obtain the contact zone 25** of the $P^+$-type.

Then a prediffusion of boron is carried out in the region **26*a* to form the P-type base 26** of the NPN transistor, the surface concentration of the impurity being about $10^{18}$ to $10^{19}$ at./cc.

Finally phosphorus is diffused to a depth of 2 to 3$\mu$ to form the N-type regions 27, 28 and 29: the region 27 is the emitter of the transistor, the region 28 is the contact zone of the collector of said transistor and the region 29 is the surface region of the Zener diode serving as a cathode. The diffusion of the region 29 and the diffusion from the region **25*a*** encounter each other so that the abrupt junction $J_2$ is formed in accordance with the invention; the diode thus has the desired characteristics, particularly an operational voltage which may be lower than 6 v.

Figure 2:
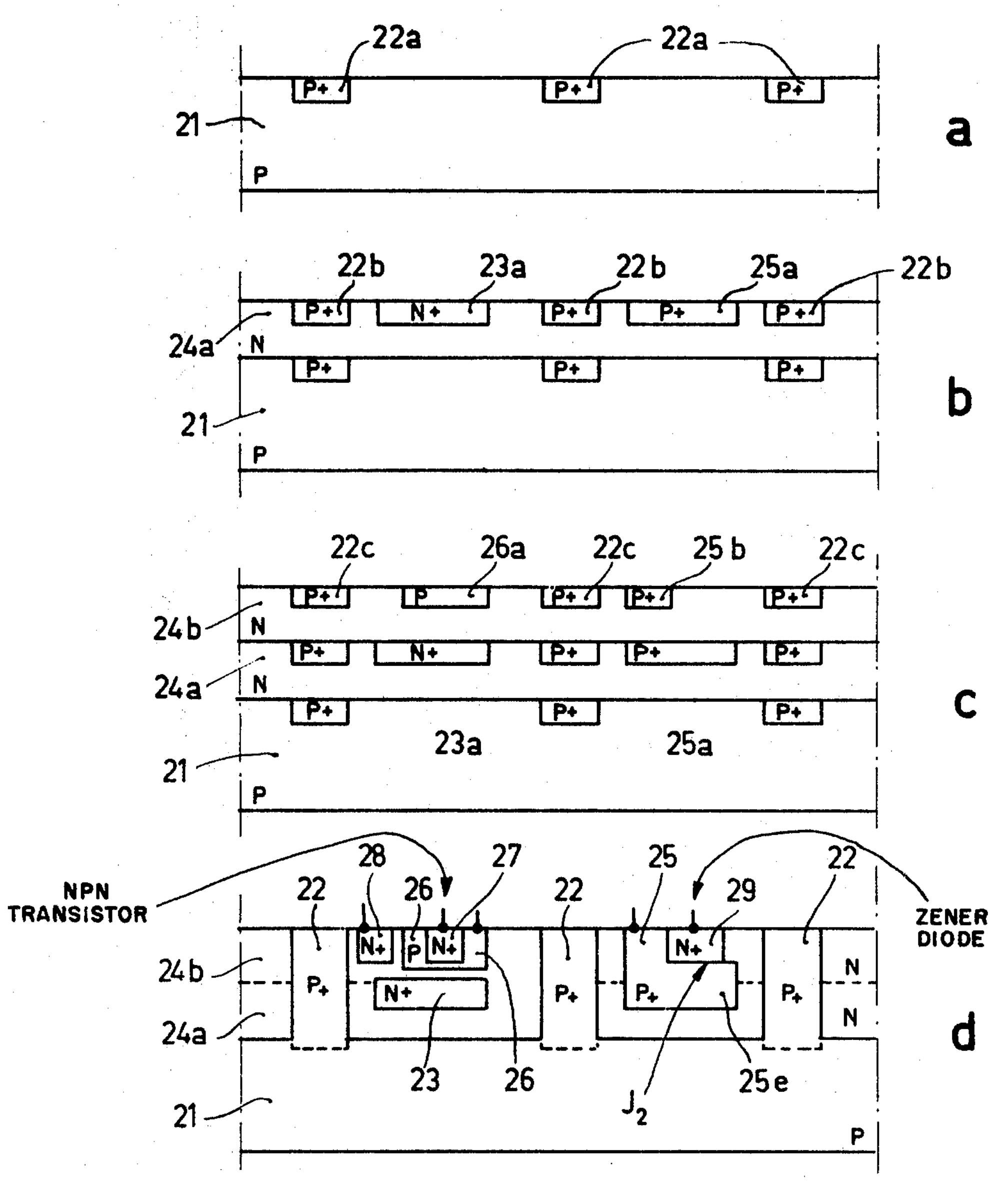

FIG. 2*d* shows that during the various diffusions the diffusion fronts from the prediffused regions **22*a*, 22*b* and 22*c* meet each other to form the isolating zones 22, which divide the layers 24*a* and 24*b*** into islands which comprise the diode and the transistor.

Also the diffusions from the regions **25*b* and 25*a*** meet each other and form the buried zone which operates as an anode and the contact zone of the diode.

It should be noted that the conventional masking oxide layers are not shown in the Figures, since the formation of such layers and the provision of windows at the desired places prior to the local diffusions are generally known. Metal tracks shown schematically as connections connected to the transistor and/or the diode may be applied in a conventional manner to such an oxide layer.

The use of two consecutive epitaxial layers (**24*a* and 24*b***) permits of combining a large number of different electronic circuit elements with a Zener diode and the said NPN transistor is given only by way of example.

Figures 3A, 3B, 4A, 4B:
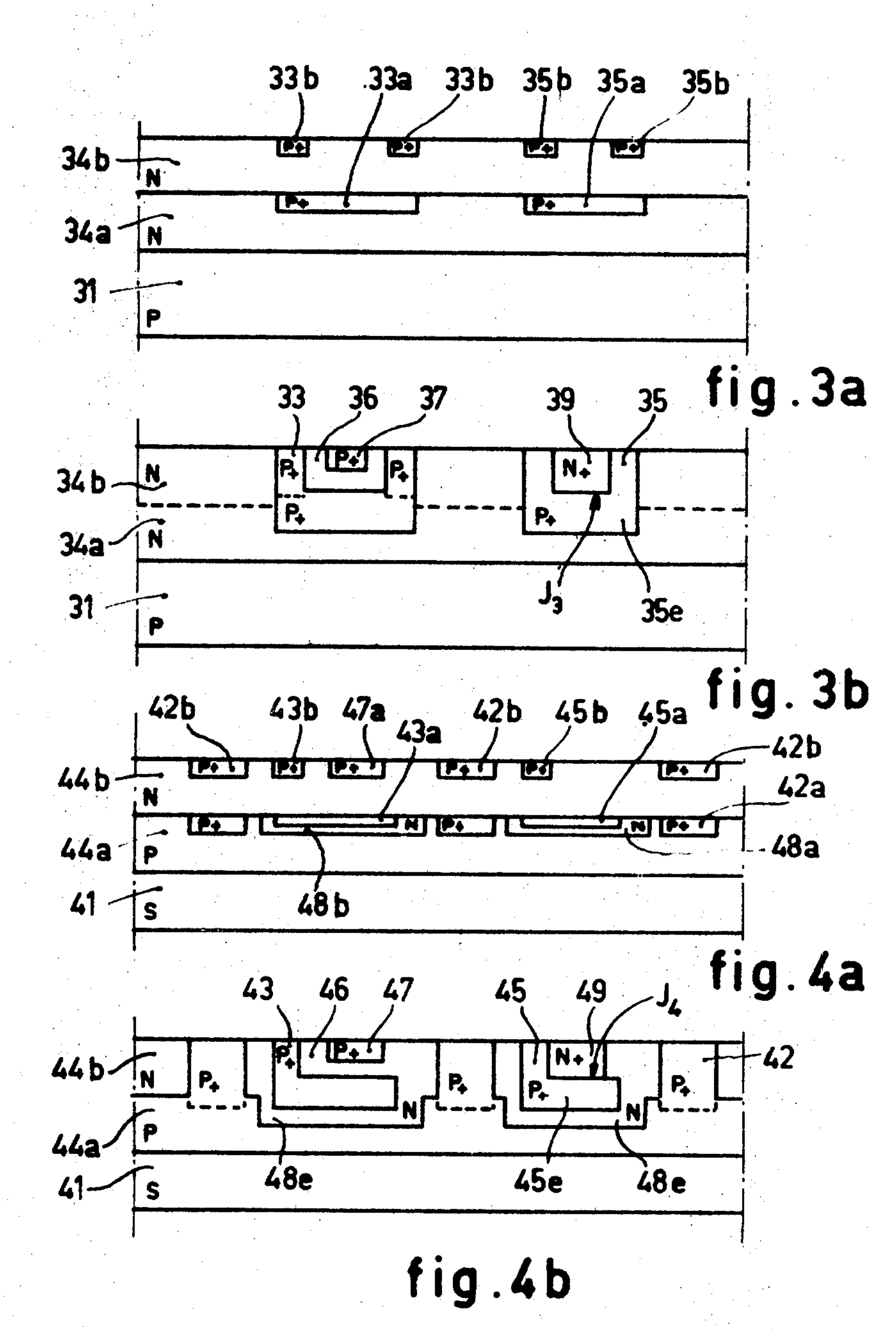

FIGS. 3*a* and 3*b* relate to the manufacture in accordance with the invention of a semiconductor device having a PNP transistor and a Zener diode, in which the insulation between the transistor and the diode is obtained in a different way.

To a P-type substrate are again applied two N-type epitaxial layers 34*a* and 34*b*. The P-type prediffused regions 33*a*, 33*b*, 35*a* and 35*b* are provided in the manner described with reference to the preceding example. The regions 33*b* and 35 form a closed configuration above the edge of the regions 33*a* and 35*a*.

The P-type emitter zone and the diffused N-type surface zone 39 of the Zener diode are then diffused and by a further diffusion from the prediffused regions the buried zone 35*c* of the diode, forming the abrupt junction with the surface zone 39 ($J_3$), the contact zone 35 which surrounds the zone 39 and the buried collector zone with the contact zone 33 of the transistor are obtained. The base zone 36 of he transistor is a nonredoped part of the epitaxial layer 33. The isolation between the transistor and the diode may be provided by the PN-junctions formed by the collector zone of the transistor and the buried zone of the diode with the epitaxial layers 34*a* and 34*b*.

FIGS. 4*a* and 4*b* relate to an example of the method according to the invention in which a substrate provided with two epitaxial layers that is to say a surface layer 44*b* and a subjacent layer 44*a* of opposite conductivity types is employed for the manufacture of a semiconductor device comprising a PNP transistor and a Zener diode.

FIG. 4*a* shows the substrate S with the P-type epitaxial layer 44*a* and the N-type epitaxial layer 44*b* and furthermore the P-type prediffused regions 42*a*, 42*b*, 43*a*, 43*b* and 45*a*, 45*b* and the second N-type prediffused regions. During the application of the N-ype diffused surface zone 49 of the diode further diffusion from the prediffused regions is involved so that the configuration of FIG. 4*b* is obtained.

The buried zone 45*e* of the Zener diode is obtained from the prediffused regions 45*a* between the two epitaxial layers 44*a* and 44*b*. The contact zone 45 is obtained from the prediffused regions 45*b*, the surface zone 49 and the buried zone 45*e* of the diode form the abrupt junction $J_4$. The diode is arranged in an island. The layer 44*b* is divided into isolated islands by the zones 42 obtained by diffusion from the prediffused regions 42*a* and 42*b*. The islands comprise portions 48*e* of the layer 44*a* obtained by diffusion from the region 48*a* and 48*b*.

The PNP transistor comprises a collector zone 43 obtained by diffusion from the regions 43*a* and 43*b*, a base zone 46 formed by a portion of the epitaxial surface layer 44*b* and an emitter zone 47 obtained by diffusion from the region 47*a*.

Other types of transistors, for example, those having a diffused base, or field-effect transistors may be arranged in an island.

The diffused isolations 42 may be replaced by grooves at the same areas. The substrate S has to be of a material not affecting the structure described. The substrate may, as an alternative, by omitted. The substrate S may furthermore consist of a P- or N-type semiconductor body.

A further embodiment will now be described with reference to FIGS. 5*a* and 5*b* for the manufacture of a semiconductor device comprising a Zener diode and a PNP transistor.

The diode having the zones 59 and 55*e* and the abrupt junction $J_5$ have the same structure as that of the preceding embodiment. A semiconductor body having an N-type substrate 51, a P-type epitaxial layer 54*a* and an N-type epitaxial layer 54*b* is used.

Figures 5A, 5B, 6, 7:
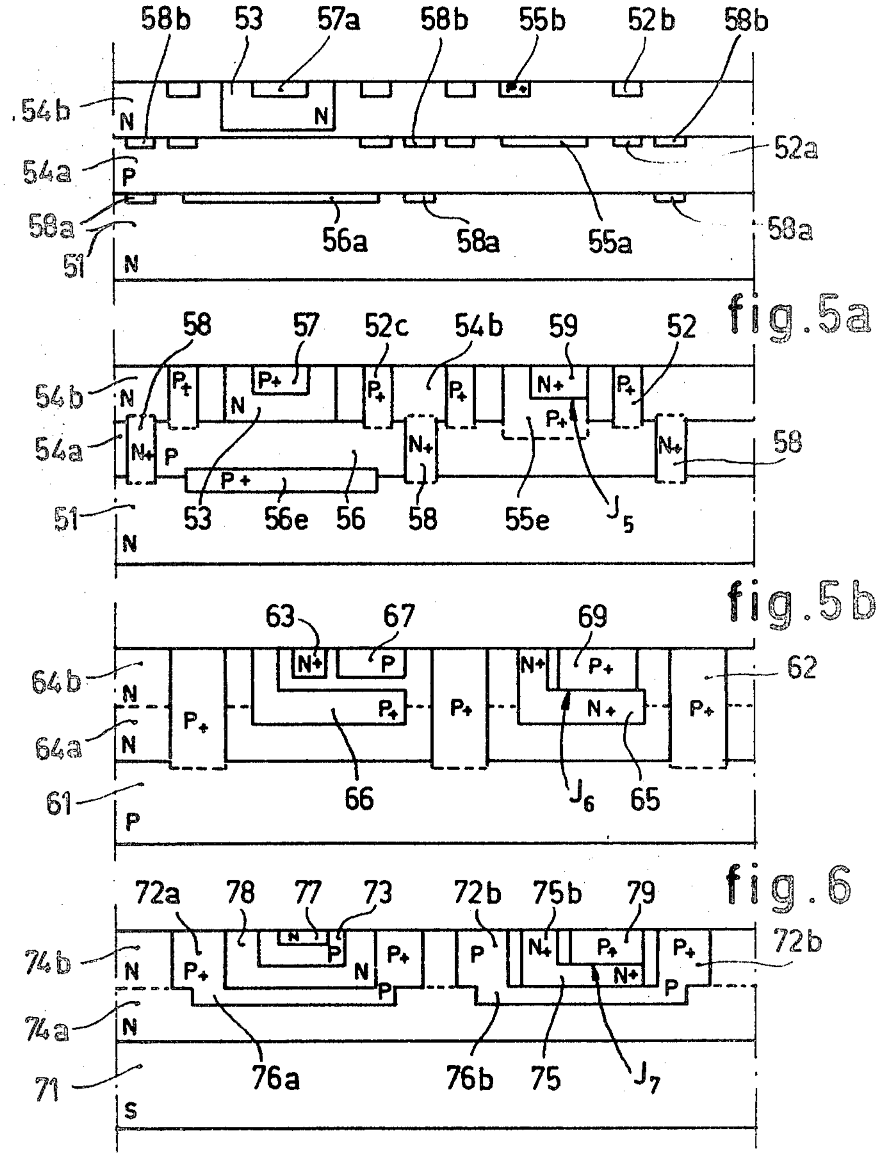
FIG. 6 is a diagrammatic sectional view of a fifth embodiment.
FIG. 7 is a diagrammatic sectional view of a sixth embodiment.

The completed diode shown in FIG. 5*b* comprises, like in the preceding embodiments, two zones 55*e* and 59 obtained by the simultaneous diffusion of opposite conductivity types to form an abrupt junction $J_5$. The buried zone 55*e* of the diode is diffused from the prediffused region 55*a* (FIG. 5*a*) and the surface zone is diffused from the surface of the surface layer 54*b*. The contact zone of the buried zone 55*e* is diffused from the region 55*b*.

The diode is completely surrounded by a P-type portion formed by part of the P-type epitaxial subjacent layer 54*a* and a P-type diffused zone 52 obtained by diffusion from the regions 52*a* and 52*b*. This P-type portion is completely surrounded by N-type material formed by the substrate 51, the N-type zones 58 obtained from the region 58*a* and 58*b* and parts of the layer 54*b*. In this way a satisfactory isolation can be obtained.

The transistor comprises a collector zone 56 as a part of the subjacent layer 54*a* having a buried P-type zone 56*e* obtained from the region 56*a* and a diffused collector contact zone 52*c* of high conductivity and of the same kind as the insulating zone 52, said contact zone surrounding completely the base zone of the transistor. The N-type base zone 53 is a diffused zone obtained by diffusion from the surface of the surface layer 54*b*. The transistor in this embodiment has the advantage of a diffused base zone.

The emitter 57 of the transistor is diffused from the region 57*a*.

The transistor shown is insulated in the same manner as the diode.

In the above embodiments of the invention the surface zone of the diode is of the same conductivity type as the epitaxial surface layer, but the reverse may also apply. This is the case in further embodiments to be described hereinafter and as before the diode according to the invention is manufactured simultaneously with the transistors chosen by way of example.

FIG. 6 shows a Zener diode whose surface zone 69 has P-type conductivity, whereas the epitaxial layers 64*a* and 64*b* applied to the substrate 61 (P-type) have N-type conductivity. The zones 69 and 65 and the abrupt junction $J_6$ of the diode and the isolating zones 62 are obtained in the same manner as the zones 29, 25*e* and 22 of FIG. 2*d*. The P-type collector zone 66 may be applied in the same manner as the zone 25*e* of FIG. 2*d*. The diffused N-type surface zone 63 is the base contact zone and the diffused P-type surface zone 67 is the emitter zone.

It is possible to isolate the diode in the preceding embodiment by means of a diffused buried layer of a conductivity type opposite that of the buried zone of the diode, said buried layer together with a diffused insulating zone in the epitaxial surface layer surrounding the diode completely and forming an insulated island. This is illustrated in FIG. 7. The semiconductor body used comprises the N-type semiconductor layers 74*a* and 74*b* applied to a substrate 71.

The diode shown in FIG. 7 comprises a diffused surface zone 79 of a type opposite that of the surface layer 74*b*. The N-type zone 79 together with the N-type buried zone 75 of the diode forms an abrupt junction $J_7$. The diode is isolated from the further part of the body by the island formed inside the P-type buried layer 76*b* and the diffused P-type zone 72*b*. An NPN transistor is indicated by way of example in a second island. This transistor comprises an N-type epitaxial collector zone 78 consisting of a portion of the surface layer 74*b*, a diffused P-type base zone 73 and a diffused N-type emitter zone 77. An $N^+$-type collector contact zone may be provided simultaneously with the contact zone 75*b* of the buried zone of the diode.

Figure 8:
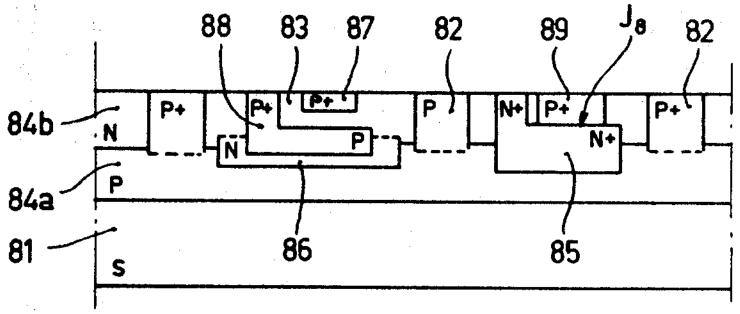
FIG. 8 is a diagrammatic sectional view of a seventh embodiment.

In other cases the semiconductor body in which the Zener diode has to be formed may comprise two layers of opposite conductivity types as is illustrated in FIG. 8. In this Figure the epitaxial layers 84*a* and 84*b* are applied by way of example to a substrate 81.

The diode shown in this Figure has a surface zone 89 of a conductivity type opposite that of the N-type surface layer 84*b*. The P-type zone 89 together with the buried N-type zone 85 forms an abrupt junction $J_8$. The diode is arranged in an isolated island. The islands are obtained by dividing the N-type layer 84*b* located on the P-type layer 84*a* into islands by means of the P-type diffused isolating zones 82. A PNP transistor is shown by way of example in a further island. The buried N-type layer 86 isolates the buried P-type layer which is part of the collector zone 88 of the transistor from the layer 84*a*. The transistor comprises an N-type base 83 consisting of a portion of the N-type surface layer 84*b* and a diffused P-type emitter zone 87. There is furthermore provided a diffused collector contact zone.

Figure 9:
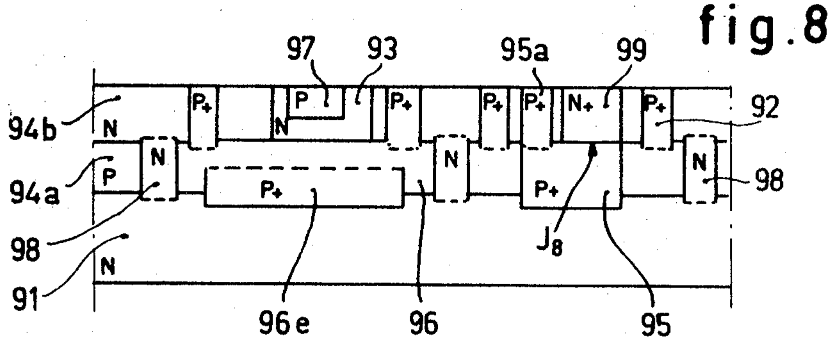
FIG. 9 is a diagrammatic sectional view of an additional embodiment.

In the preceding embodiment the abrupt junction of the diode is obtained by the encounter of two diffusions from two opposite surfaces of an epitaxial layer. An abrupt junction may also be obtained by the encounter of two diffusions from opposite faces of an assembly of two epitaxial layers of opposite conductivity types. This is illustrated in FIG. 9. The junction $J_9$ is located substantially in the interface between the epitaxial P-type layer **94*a* and the epitaxial N-type layer 94*b*. The junction is formed by a diffusion for the buried P-type diode zone 95 from a prediffused region in the N-type substrate 91 and by a diffusion for the N-type surface zone 99 of the diode. The buried zone 95 is provided with a diffused contact zone 95*a*. It is also possible to use the diffused isolating zone 92** as a contact zone.

The diode is isolated by a diffused P-type insulating zone 92 which completely surrounds the portion of the surface region comprising the surface zone of the diode 99 and by a diffused N-type isolating zone 98 extending across the subjacent layer **94*a* and surrounding completely the portion of said layer with the buried zone 95, so that the assembly of the last-mentioned zone 98, the substrate 91 and the portion of the surface layer 94*b* around the zone 92** forms an isolated island for the diode.

The transistor shown together with the diode comprises a P-type collector zone 96 formed by a portion of the epitaxial subjacent layer **94*a* and, as the case may be, a P-type buried zone 96*e*, an N-type base zone 93 formed by the diffusion throughout the thickness of the surface layer 94*b* and having the same conductivity type as the latter, and a diffused P-type emitter zone 97**. This transistor is insulated in the same manner as the diode.

As a matter of course, the embodiments described above may be modified by using equivalent technical means within the scope of the invention. For example, more than one Zener diode and more than one transistor may be applied. Moreover, other circuit elements such as resistors, field-effect transistors and capacitors may be provided.

What is claimed is:

1. A method of making a monolithic integrated semiconductor device containing a Zener diode, comprising the steps:

a. providing a semiconductor substrate part;

b. prediffusing into the surface of a portion of the substrate a first zone of one type conductivity having an impurity concentration exceeding that of the substrate portion;

c. growing on the substrate portion an epitaxial layer having an impurity concentration below that of said prediffused first zone to bury the latter;

d. diffusing into a surface of the epitaxial layer overlying the buried first zone a surface second zone of the opposite type conductivity having an impurity concentration exceeding that of the epitaxial layer and applying heat to cause in-diffusion of the second zone and out-diffusion of the buried first zone and continuing the diffusion until the in-diffused front of the surface second zone reaches the out-diffused front of the buried first zone to form an abrupt junction;

e. diffusing into the surface of the epitaxial layer overlying the buried first zone a contact third zone of the one type conductivity until its diffusion front reaches the out-diffused front of the buried first zone to form a low resistance connection thereto;

f. and making a connection to the surface of the second zone as one electrode and making a connection to the surface of the third zone as the other electrode of a Zener diode having a reverse breakdown voltage in the range between 2.5 and 6 volts determined by the high impurity gradients in the region of the said abrupt junction.

2. A method as set forth in claim 1 wherein the epitaxial layer is of the opposite type conductivity.

3. A method as set forth in claim 1 wherein the epitaxial layer is of the one type conductivity.

4. A method as set forth in claim 1 wherein the epitaxial layer comprises a first portion of one type conductivity on the substrate and a second portion of opposite type conductivity on the first epitaxial portion, the surface second zone and contact third zone are diffused into the surface of the second epitaxial portion, and the diffusions are such that the buried first zone has a thickness substantially the same thickness as the first epitaxial portion, and the surface second zone has substantially the same thickness as the second epitaxial portion.

5. A method as set forth in claim 1 wherein the contact third zone is annular and completely surrounds the surface second zone.

6. A method as set forth in claim 1 wherein the substrate part is of the one type conductivity, the epitaxial layer is of the opposite type conductivity, prior to prediffusing the first zone an isolation fourth zone of the opposite type conductivity is diffused into the substrate part and the first zone is then prediffused into the fourth zone which isolates the first zone from the substrate part of one type conductivity, and the Zener diode is isolated from the epitaxial layer by diffusing zones of one type conductivity through the epitaxial layer into the substrate part.

7. A method of making a monolithic integrated semiconductor device containing a Zener diode, comprising the steps:

a. providing a semiconductor substrate part of the one type conductivity;

b. growing on the substrate part a first epitaxial layer of the opposite type conductivity;

c. prediffusing into the surface of a portion of the first epitaxial layer a first zone of one type conductivity having an impurity concentration exceeding that of the substrate and the first epitaxial layer;

d. growing on the first epitaxial layer portion a second epitaxial layer of the opposite type conductivity having an impurity concentration below that of said prediffused first zone to bury the latter;

e. diffusing into a surface of second epitaxial layer overlying the buried first zone a surface second zone of the opposite type conductivity having an impurity concentration exceeding that of the epitaxial layers and applying heat to cause in-diffusion of the second zone and out-diffusion of the buried first zone and continuing the diffusion until the in-diffused front of the surface second zone reaches the out-diffused front of the buried first zone to form an abrupt junction;

f. diffusing into the surface of the second epitaxial layer overlying the buried first zone a contact third zone of the one type conductivity until its diffusion front reaches the out-diffused front of the buried first zone to form a low resistance connection thereto;

g. diffusing isolation regions of said one type conductivity through the first and second epitaxial layers to define an opposite type island surrounding the first, second and third zones;

h. and making a connection to the surface of the second zone as one electrode and making a connection to the surface of the third zone as the other electrode of a Zener diode having a reverse breakdown voltage in the range between 2.5 and 6 volts determined by the high impurity gradients in the region of the said abrupt junction.

8. A method of making a monolithic integrated semiconductor device containing a Zener diode, comprising the steps:

a. providing a semiconductor substrate part of the one type conductivity;

b. growing on the substrate part a first epitaxial layer of the opposite type conductivity;

c. prediffusing into the surface of a portion of the first epitaxial layer a first zone of opposite type conductivity having an impurity concentration exceeding that of the substrate and the first epitaxial layer;

d. growing on the first epitaxial layer portion a second epitaxial layer of the one type conductivity having an impurity concentration below that of said prediffused first zone to bury the latter;

e. diffusing into a surface of second epitaxial layer overlying the buried first zone a surface second zone of the one type conductivity having an impurity concentration exceeding that of the epitaxial layers and applying heat to cause in-diffusion of the second zone and out-diffusion of the buried first zone and continuing the diffusion until the in-diffused front of the surface second zone reaches the out-diffused front of the buried first zone to form an abrupt junction;
f. diffusing into the surface of the second epitaxial layer overlying the buried first zone a contact third zone of the opposite type conductivity until its diffusion front reaches the out-diffused front of the buried first zone to form a low resistance connection thereto;
g. diffusing isolation regions through the first and second epitaxial layers to define an island surrounding the first, second and third zones;
h. and making a connection to the surface of the second zone as one electrode and making a connection to the surface of the third zone as the other electrode of a Zener diode having a reverse breakdown voltage in the range between 2.5 and 6 volts determined by the high impurity gradients in the region of the said abrupt junction.

9. A method of making a monolithic integrated semiconductor device containing a Zener diode, comprising the steps:
a. providing a semiconductor substrate part;
b. growing on the substrate part a first epitaxial layer of the one type conductivity;
c. prediffusing into the surface of a portion of the first epitaxial layer a first zone of opposite type conductivity and a second zone of the one type conductivity both having an impurity concentration exceeding that of the substrate and the first epitaxial layer;
d. growing on the first epitaxial layer portion a second epitaxial layer of the one type conductivity having an impurity concentration below that of said prediffused first and second zones to bury the latter;
e. diffusing into a surface of second epitaxial layer overlying the buried first zone a surface third zone of the opposite type conductivity having an impurity concentration exceeding that of the epitaxial layers and applying heat to cause in-diffusion of the third zone and out-diffusion of the buried second zone and continuing the diffusion until the in-diffused front of the surface third zone reaches the out-diffused front of the buried second zone to form an abrupt junction;
f. diffusing into the surface of the second epitaxial layer overlying the buried second zone a contact fourth zone of the one type conductivity until its diffusion front reaches the out-diffused front of the buried second zone to form a low resistance connection thereto;
g. diffusing isolation regions of said opposite type conductivity through the second epitaxial layer to define with the buried first zone an opposite type island surrounding the second, third and fourth zones;
h. and making a connection to the surface of the third zone as one electrode and making a connection to the surface of the fourth zone as the other electrode of a Zener diode having a reverse breakdown voltage in the range between 2.5 and 6 volts determined by the high impurity gradients in the region of the said abrupt junction.